United States Patent
Al-Kadry et al.

(10) Patent No.: US 10,862,263 B1
(45) Date of Patent: Dec. 8, 2020

(54) FEMTOSECOND LASER SOURCE AND MULTIPHOTON MICROSCOPE

(71) Applicant: MPB Communications Inc., Montreal (CA)

(72) Inventors: Alaa Al-Kadry, Montreal (CA); Vladimir Karpov, Pointe-Claire (CA); Wallace Raymond Lovett Clements, Pointe-Claire (CA)

(73) Assignee: MPB COMMUNICATIONS INC., Pointe-Claire (CA)

( * ) Notice: Subject to any disclaimer, the term of this patent is extended or adjusted under 35 U.S.C. 154(b) by 0 days.

(21) Appl. No.: 16/892,242

(22) Filed: Jun. 3, 2020

(51) Int. Cl.
  *H01S 3/30* (2006.01)
  *H01S 3/094* (2006.01)
  *H01S 3/23* (2006.01)
  *H01S 3/067* (2006.01)
  *H01S 3/102* (2006.01)
  *H01S 3/11* (2006.01)

(52) U.S. Cl.
  CPC .......... *H01S 3/302* (2013.01); *H01S 3/06758* (2013.01); *H01S 3/094053* (2013.01); *H01S 3/094076* (2013.01); *H01S 3/1024* (2013.01); *H01S 3/1106* (2013.01); *H01S 3/2316* (2013.01)

(58) Field of Classification Search
  CPC ...... H01S 3/30; H01S 3/302; H01S 3/094076; H01S 3/1024; G02F 1/3526
  See application file for complete search history.

(56) References Cited

U.S. PATENT DOCUMENTS

| | | | |
|---|---|---|---|
| 2009/0028193 A1* | 1/2009 | Islam | H01S 3/06754 372/6 |
| 2009/0097512 A1* | 4/2009 | Clowes | H01S 3/10 372/21 |
| 2019/0173256 A1* | 6/2019 | Fevrier | G01N 21/6458 |

OTHER PUBLICATIONS

A. M. Chandran et al. "Nanosecond pulsed 620 nm source by frequency-doubling a phosphosilicate Raman fiber amplifier", vol. 44, No. 24 / Dec. 15, 2019 / Optics Letters, published Dec. 10, 2019, p. 6025-6028.

Matthias Eibl et al. "Pulse-to-pulse wavelength switching of a nanosecond fiber laser by four-wave mixing seeded stimulated Raman amplification", vol. 42, No. 21 / Nov. 1, 2017 / Optics Letters, published Oct. 24, 2017, p. 4406-4409.

T. H. Runcorn et al. "Watt-level Nanosecond 589 nm Source by SHG of a Cascaded Raman Amplifier", Lasers Congress 2016 (ASSL, LSC, LAC) OSA Technical Digest (online) (Optical Society of America, 2016), paper ATh1A.3, https://doi.org/10.1364/ASSL.2016.ATh1A.3, dated Jan. 2016.

Matthias Eibl et al. "Wavelength agile multi-photon microscopy with a fiber amplified diode laser", vol. 9, No. 12 | Dec. 1, 2018 | Biomedical Optics Express 6273, published Nov. 15, 2018, p. 6273-6282.

T. H. Runcorn et al. "Duration-tunable picosecond source at 560 nm with watt-level average power", vol. 40, No. 13 / Jul. 1, 2015 | Optics Letters, p. 3085-3088, published Jun. 24, 2015.

(Continued)

*Primary Examiner* — Eric L Bolda
(74) *Attorney, Agent, or Firm* — Anglehart et al.

(57) ABSTRACT

Good femtosecond fiber laser performance is achieved by producing picosecond Raman shifted pulses of sufficient intensity to undergo self-phase modulation (SPM), thus causing the pulses to advantageously spread spectrally, which then makes it possible to temporally compress the pulses with an optical compressor to produce femtosecond pulses with high peak power.

13 Claims, 5 Drawing Sheets

(56) References Cited

OTHER PUBLICATIONS

T. H. Runcorn et al. "Fiber-integrated frequency-doubling of a picosecond Raman laser to 560 nm", © 2015 OSA, Jun. 15, 2015 | vol. 23, No. 12 | DOI:10.1364/OE.23.015728 | Optics Express 15728, published Jun. 5, 2015.

* cited by examiner

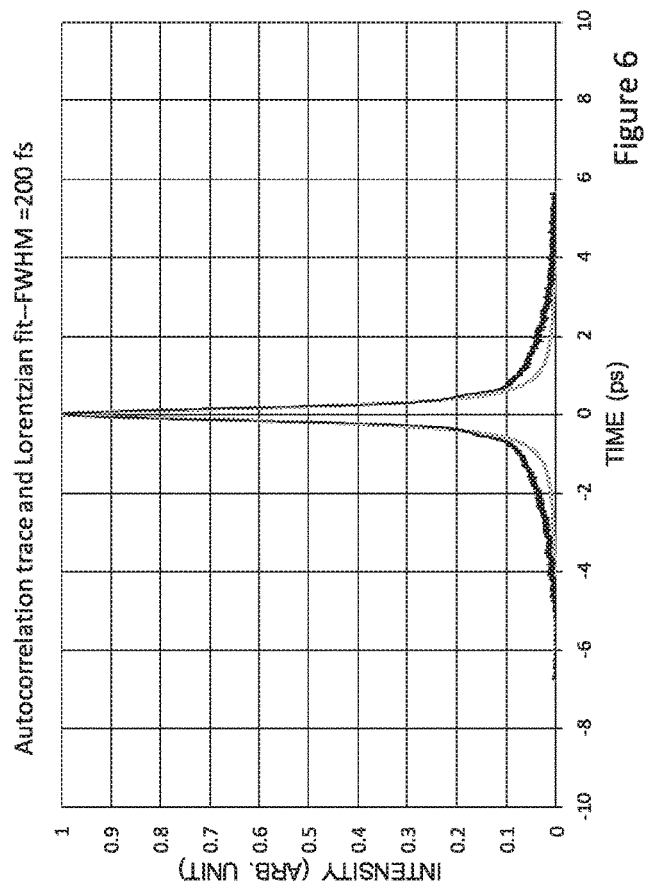
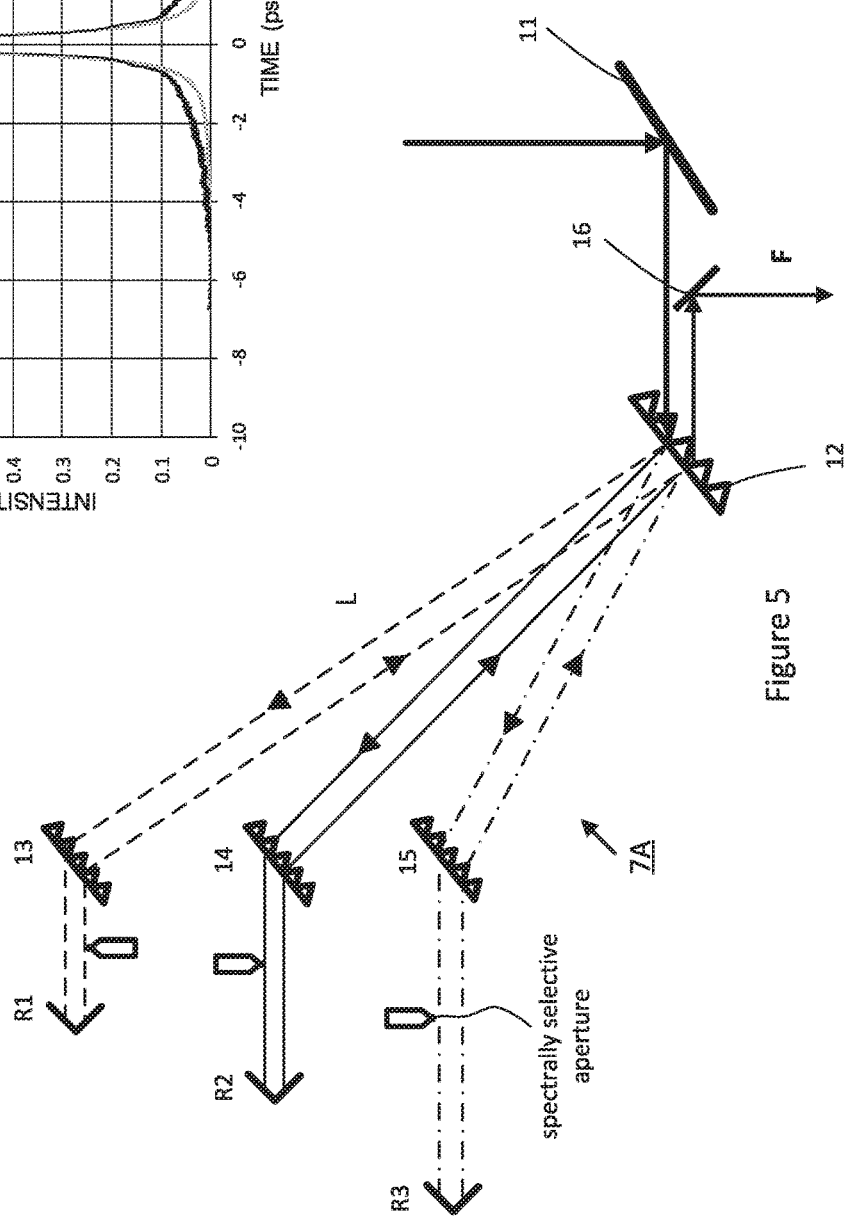

FEMTOSECOND LASER SOURCE AND MULTIPHOTON MICROSCOPE

TECHNICAL FIELD

This disclosure relates to laser sources, more particularly to femtosecond pulse duration laser sources, and to multiphoton microscopy.

BACKGROUND

A common application of tunable sources of femtosecond laser pulses is in multi-photon microscopy (MPM) for biological imaging. MPM is a nonlinear microscopy technique used to image deep layers in living tissues with submicrometer spatial resolution. In this technique, high-peak-power pulses of pulsed lasers are focused to high intensities to drive multi-photon absorption in molecules used as fluorescent labels. It has been reported that the optimum penetration depth in tissue is dependent on the excitation wavelength of the laser. It is thus advantageous in an analysis if two or more pulses at different wavelengths were used to image simultaneously different structures of the tissue, for example, brain tissue.

The development of various fluorescent indicators, particularly genetically engineered probes based on fluorescent proteins, has further enhanced the capabilities of MPM. There are several fluorescent proteins that can be excited by multi-photon absorption in the near-infrared (NIR) region of the electromagnetic spectrum. These include green fluorescent proteins and red fluorescent proteins that can be excited by pulsed lasers with central wavelengths ranging from 900 nm to 1300 nm. In each case, the absorption band of the fluorophore is sufficiently wide that there is a tolerance of about ±30 nm or greater around a nominal peak within which the fluorophore can be effectively excited.

Ultrafast lasers employing solid-state gain media are the most commonly used sources for this application. This is mainly due to the very broad gain bandwidth of such lasers. Titanium-doped sapphire (Ti:sapphire) lasers, in which laser oscillation can be achieved over a wavelength range between about 650 nm and 1080 nm, are the most commonly used lasers. These laser sources are relatively expensive due to the fact that the gain media are pumped by expensive visible continuous wave (CW) lasers. The lasers operate at about 100 MHz and with pulse energies in the 20-30 nJ range. A wider wavelength tuning range can be achieved by using a Ti:sapphire laser as a pump together with an optical parametric oscillator (OPO). However, these lasers are large and even more expensive.

Fiber lasers are attractive for imaging applications as their all-fiber architecture eliminates the need for precise optical alignment, ensures good beam quality and makes them inherently suitable for integration with endoscopic instruments. In addition, since their fiber gain media are efficient, these lasers can easily supply the power needed for bioimaging.

Recently demonstrated femtosecond ytterbium (Yb)-based fiber lasers can match, and even exceed, the performance of solid-state lasers at one wavelength. However, presently, fiber-based systems lack the tunability of solid-state lasers.

Pulses having wavelengths spanning the above-mentioned NIR range can be provided by using an ultrafast fiber laser or fiber master-oscillator power amplifier (MOPA) to pump an OPO. This, however, adds another layer of cost and complexity to the laser system. Furthermore, only one wavelength can be generated at any one time.

Raman fiber lasers are an excellent alternative to extend the output wavelength range of Yb-based fiber lasers to cover the region between 1100 nm and 1300 nm. Various approaches have been proposed to convert the output power from doped fiber gain regions to wavelengths in the 1100 to 1300 nm range. One way to achieve this is to use stimulated Raman scattering (SRS) in the fiber itself. This is achieved with either a Raman fiber laser, where a resonator is built for one wavelength or, with a single-pass Raman fiber amplifier, where a seed signal is amplified by SRS through interaction with an intense pulsed pump. Using the latter architecture, Raman pulses of narrow line-width have been generated by using an Yb fiber amplifier to amplify a pulsed source in the Yb gain band to provide the intense pump and then combining this with a low-power seed at a Raman-shifted wavelength to propagate in an un-doped Raman optical fiber or a phosphosilicate (p-doped) Raman fiber. In all these demonstrations, the output of the system consisted of a single wavelength at a time with, in cases where the output pulses were to be frequency doubled, special attention being paid to keeping the spectral bandwidth of the pulses as narrow as possible to achieve highly-efficient second harmonic generation (SHG). The temporal duration of the demonstrated pulses ranged from a few hundred picoseconds to about a nanosecond.

However, it is known that protein fluorescence is proportional to the peak power of pulses, which would require 10-100 kW to have effective fluorescence. The individual pulse energy of picosecond lasers with peak powers in this range is high and, when operating at repetition rates of a few MHz, would result in high average power values. This may, however, lead to tissue damage which is proportional to the average power of the system. Reducing the repetition rate of picosecond lasers to the kHz range would help avoid the tissue damage; however, this would increase the time required to collect images. It is thus preferable to use femtosecond laser systems for MPM due to the fact that high peak power pulses can be achieved while maintaining low average power values at MHz repetition rates.

SUMMARY

Applicant has discovered that good femtosecond fiber laser performance can be achieved by producing picosecond Raman shifted pulses of sufficient intensity to undergo self-phase modulation (SPM), thus causing the pulses to advantageously spread spectrally, which then makes it possible to temporally compress the pulses with an optical compressor to produce femtosecond pulses with high peak power.

In some embodiments, a femtosecond laser system may have a pump laser source emitting a train of picosecond-range optical pump pulses which are then amplified in at least one fiber amplifier. At least one CW seed source, with a wavelength longer than that of the pump source, is coupled to a length of optical fiber along with the amplified output of the pump laser source so that the emission from the CW seed source co-propagates with the train of picosecond-range optical pump pulses, and at least one Raman shift conversion takes place in the length of fiber to produce picosecond pulses, at the wavelength of the CW seed source, of sufficient peak intensity that SPM of the Raman shifted pulses takes place in the length of fiber to advantageously produce a spectrally-broadened pulse train of picosecond-range optical pulses. At least one optical pulse compressor is used to temporally compress the spectrally-broadened pulse train of picosecond-range optical pulses to a train of femtosecond-range duration pulses. In this way, the peak power of the train of picosecond-range optical pump pulses leads to efficient Raman conversion and SPM of the Raman shifted pulses in the length of optical fiber so that the optical compressor can efficiently provide the train of femtosecond-range pulses at the wavelength of the Raman shifted pulses.

The pump laser source may comprise at least one optical fiber amplifier. The pump laser source may comprise a mode-locked laser. The laser system may further comprise a switch for controlling the CW seed source so that emission of femtosecond-range pulses can be controlled by the switch.

The laser system may further comprise a controller for said switch for temporally modulating the CW seed source for selecting a variable repetition rate for the train of femtosecond-range pulses comprising emission at a wavelength corresponding to said Raman shift.

The laser system may have two CW seed sources, the train of femtosecond-range pulses may have emission at the two CW seed wavelengths, corresponding to two Raman shifts.

The controller may control the switch for temporally modulating the CW seed sources for emitting femtosecond pulses alternating between the two seed source wavelengths.

The controller may select between zero, one and two Raman shift wavelengths being present in said train of femtosecond-range pulses.

The at least one optical fiber amplifier may comprise a by-pass optical fiber amplifier whose output by-passes the length of optical fiber in which the at least one Raman shift conversion takes place and is propagated in a second length of optical fiber to be spectrally broadened via SPM.

The length of optical fiber in which the at least one Raman shift conversion takes place may comprise phosphorous-doped silica optical fiber.

The length of optical fiber in which the at least one Raman shift conversion takes place may comprise silica optical fiber.

The at least one CW seed source can be launched into the at least one of the at least one optical fiber amplifier to propagate together with the train of picosecond-range optical pump pulses through the fiber amplifier and then into the length of optical fiber in which the at least one Raman shift conversion takes place.

The at least one optical pulse compressor can be wavelength tunable.

In other embodiments, a multi-photon microscope comprises a laser system as described above and a controller for receiving user input for defining an operation of the at least one CW seed source to define at least one of the at least one wavelength of the Raman shifted pulses and a repetition rate of the Raman shifted pulses at the at least one defined wavelength. The controller for receiving user input can define both the wavelength of the Raman shifted pulses and the repetition rate of the Raman shifted pulses at the at least one wavelength defined by the controller.

BRIEF DESCRIPTION OF THE DRAWINGS

The invention will be better understood by way of the following detailed description of embodiments of the invention with reference to the appended drawings, in which:

FIG. 5 is a two-dimensional view schematically depicting a spectrally-selective pulse-compressor according to a first embodiment;

FIG. 6 is a reproduction of an autocorrelation-trace of a pulse formed by selecting 20 nm of the 1189.5 nm spectral-band of FIG. 3 after compression in the spectrally selective pulse-compressor.

DETAILED DESCRIPTION

Figure 1:
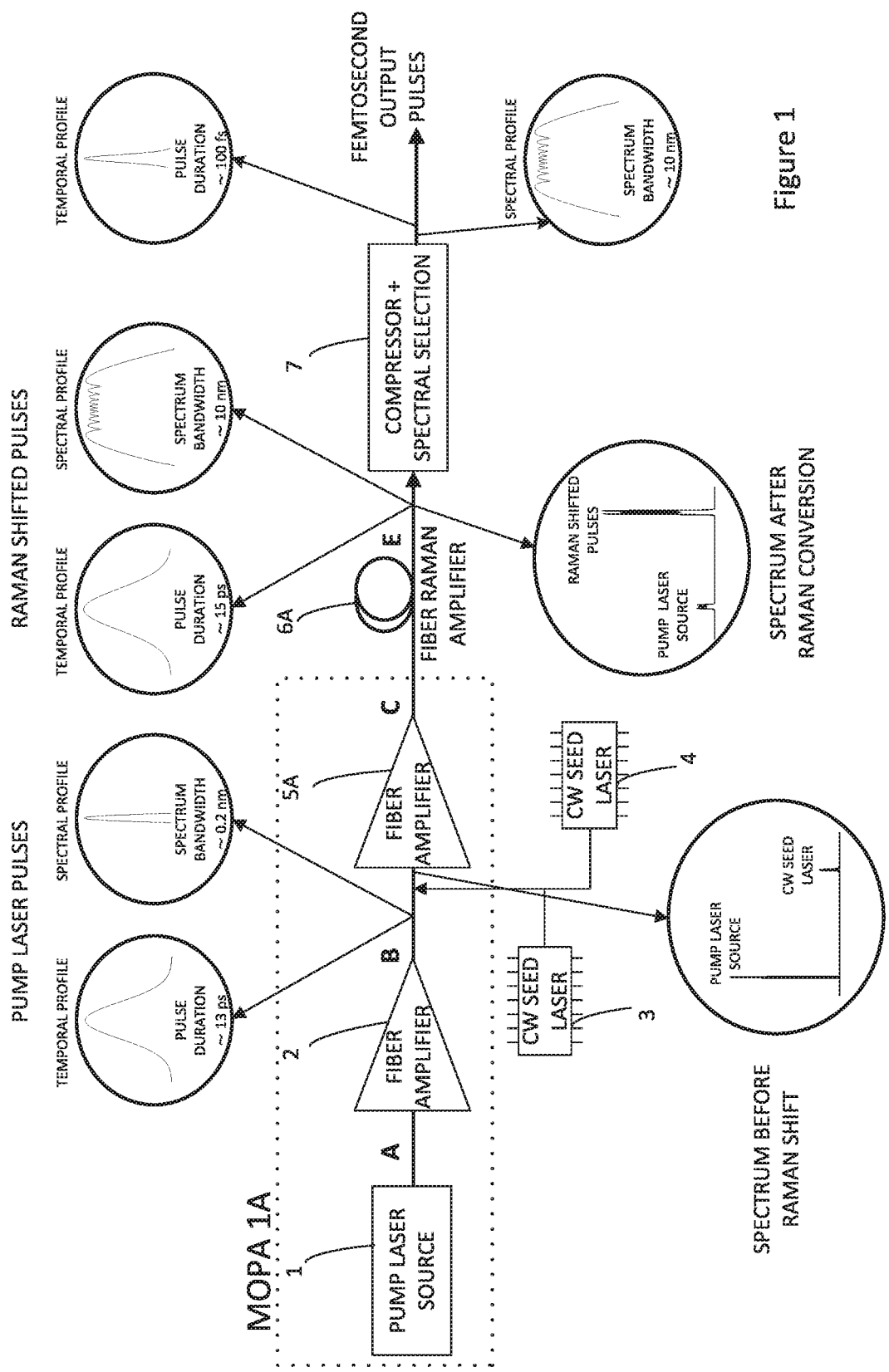
FIG. 1 is a schematic diagram of a femtosecond laser having two seed sources, a Raman fiber amplifier and no by-pass fiber amplifier for pulses generated by the MOPA.

FIG. 1 schematically illustrates a preferred embodiment of apparatus providing a single-wavelength or multi-wavelength Raman femtosecond laser source. The apparatus includes a picosecond fiber-MOPA 1A, either one or two CW seed lasers 3 and 4 (more than two CW seed sources can be used), a fiber Raman amplifier 6A and spectrally selective pulse-compressor 7. This system as illustrated can deliver femtosecond pulses to a target, for example, within the response time of a CCD, at one or more wavelengths corresponding to the CW seed wavelength(s).

Fiber MOPA 1A includes a pump laser source 1 arranged to deliver a train of single-mode, picosecond pulses at a pulse repetition frequency (PRF) from few MHz to about 100 MHz. These pulses can be amplified by a first fiber-amplifier 2 and can be combined with the CW seed laser output(s) and can then be delivered to a second fiber-amplifier 5A. The output of fiber-amplifier 5A is then launched into a fiber Raman amplifier 6A where the propagation of the amplified pump pulses together with the optical power from the CW seed laser(s) leads to stimulated Raman scattering (SRS) (spectral shift) of the pump pulses resulting in the formation and growth of high-peak-power optical pulses at the seed laser wavelength(s) and the subsequent SPM spectral broadening of these Raman shifted pulses along the length of fiber Raman amplifier 6A. The output pulses are then directed to a pulse-compressor 7. In the spectrally selective pulse-compressor 7, the duration of the pulses is (temporally) compressed to value between about 80 fs and about 300 fs.

As indicated in FIG. 1, the pulses from source 1 as amplified by amplifier 2 can be approximately 13 ps in width, namely full-width half-maximum (FWHM). Their spectral bandwidth can be about 0.2 nm. Following Raman conversion to the seed wavelength in the length of fiber 6A, the pulse width broadens temporally by a small amount, for example to about 15 ps, however, the spectral broadening is significant, namely to about 10 nm (a factor of 5).

The fiber Raman amplifier 6A could be based on silica or p-doped silica fiber. The silica and p-doped fibers differ in their Raman gain properties. The silica fiber possesses a rather broad Raman gain band (~100 $cm^{-1}$) and a Raman shift peak of ~440 $cm^{-1}$. However, the Raman spectrum of p-doped silica fibers has an additional, with respect to silica fibers, narrow band peak, shifted by 1320 cm$^{-1}$ (which is approximately three times larger than the frequency shift in silica fibers).

Figure 2:
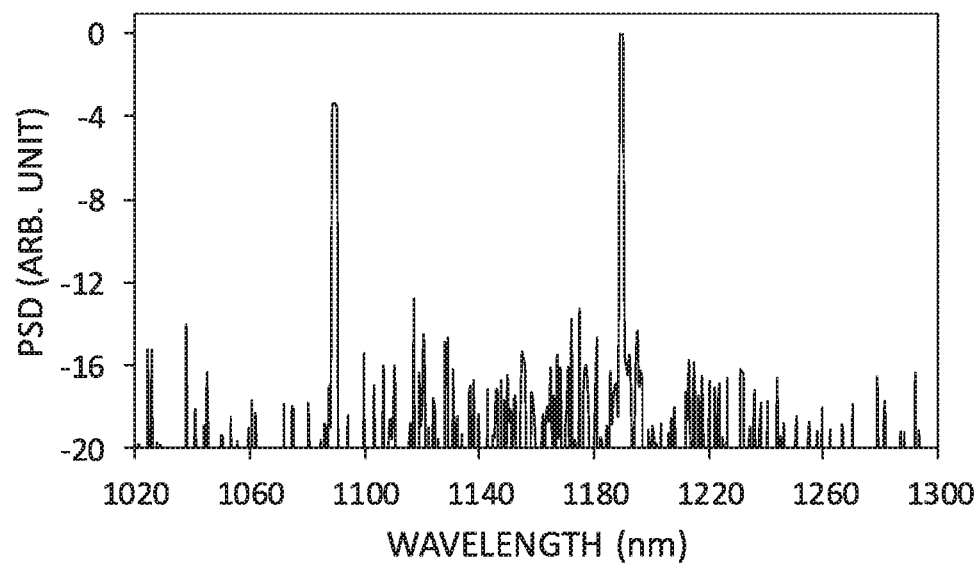
FIG. 2 is a graph schematically illustrating measured intensity as a function of wavelength (spectrum) of the seed lasers collected from the Raman fiber amplifier in the apparatus of FIG. 1.

In one example of fiber-MOPA 1A, pump laser source 1 is a Yb-doped fiber-oscillator which delivers pulses at a wavelength of about 1030 nm±1 nm. The oscillator delivers (at point A in FIG. 1) pulses having a FHWM duration of about 13 ps at a PRF of about 30 MHz. The pulses have a FWHM spectral bandwidth of about 0.23 nm. The average power of the pulse train at point A is about 16 mW. The two CW seed lasers 3 and 4 are centered at wavelengths of about 1090 nm and 1189.5 nm, respectively. The choice of the wavelengths is based on the shifts of the Raman gain peaks of the fiber comprising the fiber Raman amplifier 6A, and the number of wavelengths can be one or many. FIG. 2 is a graph schematically illustrating measured intensity as a function of wavelength (spectrum) of CW seed lasers 3 and 4.

At point B, following amplification in amplifier 2, the pulse-train has an average power of about 70 mW (more than four times gain). At point C, following amplification in amplifier 5A, the pulse-train has an average power of about 1.1 W (a gain of more than 15), the pulse bandwidth is about 1 nm (this is about four times greater than prior to amplification), and the pulse-duration is about 15 ps (an increase of about 15%). A length of p-doped optical fiber 6A (for example, about 55 m long) is arranged to receive the amplified optical pump pulses combined with CW power from seed lasers 3 and/or 4 and spectrally convert the pulses by SRS into the selected central wavelengths of the CW seed lasers 3 and/or 4. The wavelength of CW seed laser 3 is centered close to the silica first-Stokes Raman-shift gain peak of p-doped fiber (Raman shift peak=440 cm$^{-1}$) and that of CW seed laser 4 is centered close to the phosphorous first-Stokes Raman-shift peak of p-doped fiber (Raman shift peak=1320 cm$^{-1}$). As the Raman shifted pulses are being amplified to high peak powers as they propagate along the length of fiber of fiber Raman amplifier 6A, they undergo spectral broadening due to SPM, resulting in the output pulses having a bandwidth sufficient for the generation of femtosecond pulses.

Figure 3:
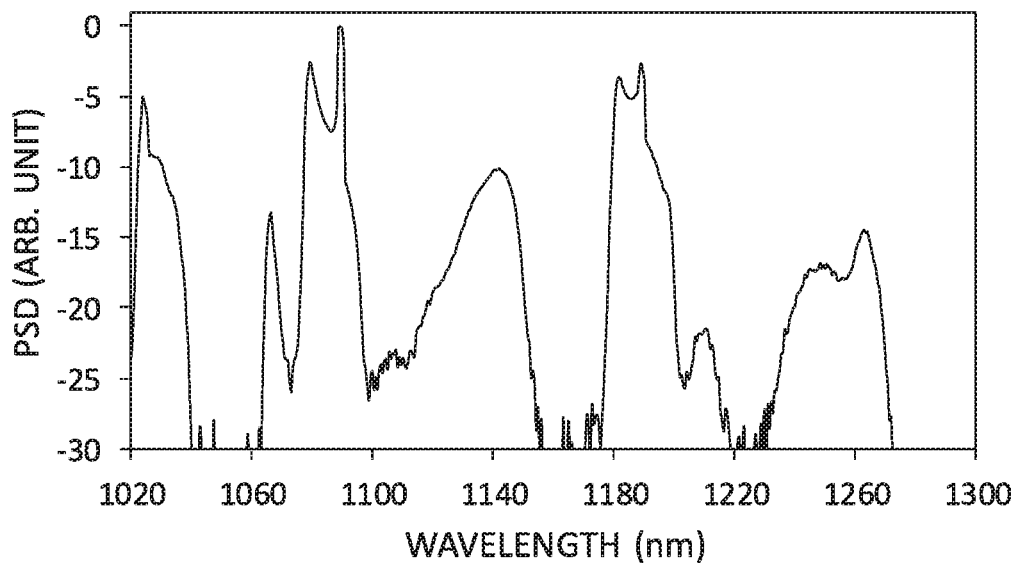
FIG. 3 is a graph schematically illustrating measured intensity as a function of wavelength (spectrum) of Raman-pulses obtained from an experimental version of the apparatus of FIG. 1.

FIG. 3 is a graph illustrating the measured intensity as a function of wavelength (spectrum) at the output of fiber Raman amplifier 6A, showing the spectra of the Raman pulses obtained from an experimental version of the apparatus of FIG. 1. The bandwidth of Raman pulses generated from this fiber-MOPA at 1090 nm is 13 nm, while the bandwidth of the Raman pulses at 1190 nm is 10 nm. This means that the Raman pulses have been spectrally broadened by a factor of approximately 10 to 13 times. More than half of the total power is in the wavelength bands around 1090 nm and 1189.5 nm. Following the passage through pulse-compressor 7, the pulse-duration is reduced to about 150 fs. The peak power of the compressed Raman pulses is about 80 kilowatts (kW).

It is also possible to select CW seed laser 3 with a central wavelength at 1130 nm and CW seed laser 4 at a wavelength of 1189.5 nm, and combine them with 1030-nm picosecond pulses in the p-doped fiber. CW seed laser 3 is centered at the second-Stokes silica Raman shift of the 1030-nm pump laser source (Raman shift peak=880 cm$^{-1}$) and CW seed laser 4 is centered close to the phosphorous first-Stokes Raman-shift gain peak of p-doped fiber (Raman shift peak=1320 cm$^{-1}$). In this case, the pulses generated are at 1130 nm and 1189.5 nm central wavelengths.

Figure 4:
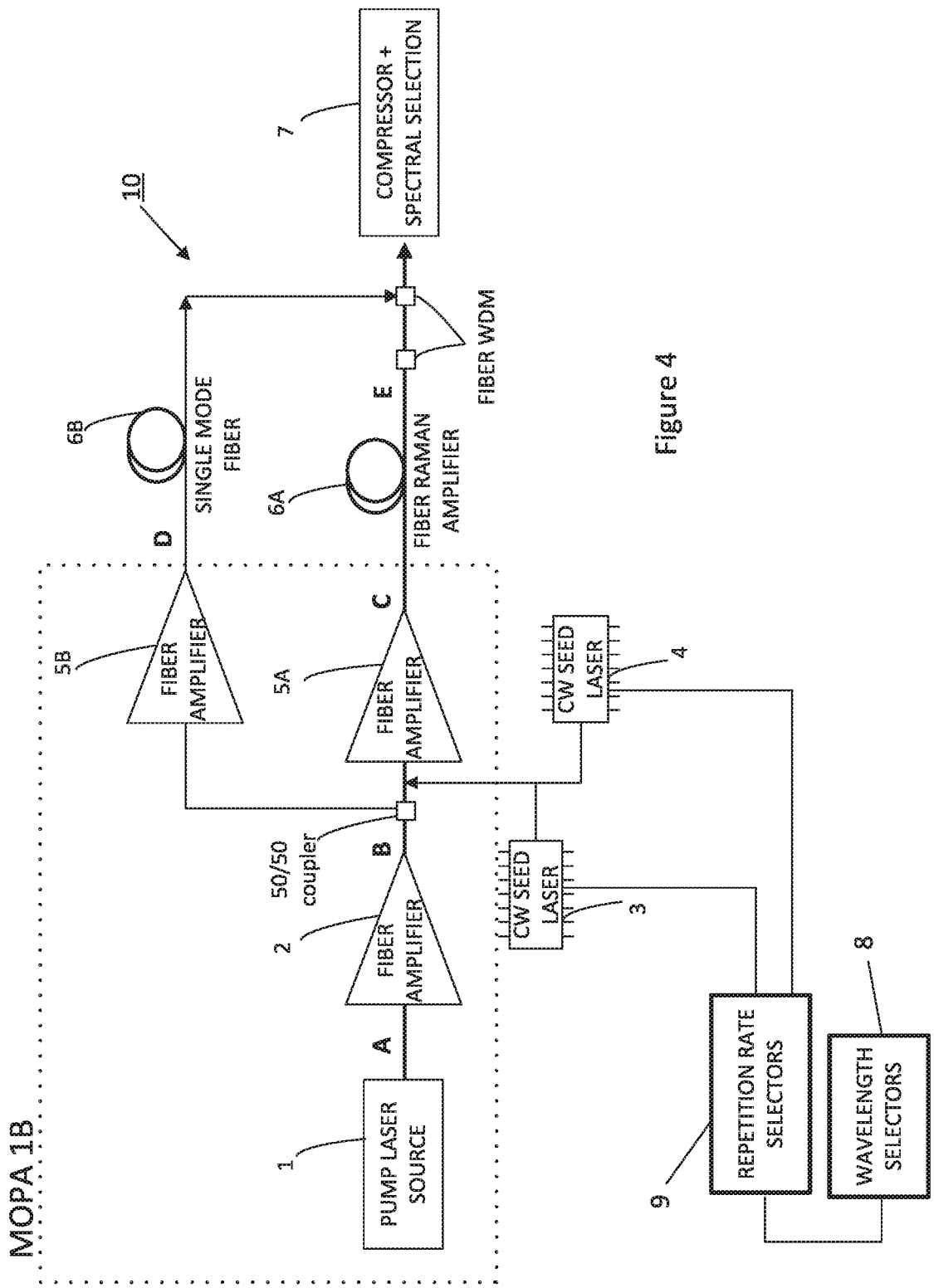
FIG. 4 is a schematic diagram of a femtosecond laser having two seed sources, a Raman fiber amplifier and a by-pass fiber amplifier for pulses generated by the MOPA.

FIG. 4 schematically illustrates another preferred embodiment of apparatus providing a multi-wavelength Raman femtosecond laser source. The apparatus includes a picosecond fiber-MOPA 1B, may include either one or two of CW seed lasers 3 and 4, a fiber Raman amplifier 6A and spectrally selective pulse-compressor 7.

Spectrally selective pulse-compressor 7 is configured to deliver output-pulses at one or more of NIR wavelengths in response to receiving input-pulses from fiber Raman amplifier 6A. One of the possible output-pulses from the compressor has a center-wavelength the same as CW seed laser 3; a second has a possible center-wavelength the same as that of CW seed laser 4; and a third has a possible center-wavelength the same as the (fundamental) wavelength of the pump laser source 1. The three output-pulses are identified as the MPM-useful wavelengths. While reference is made herein to the application of the laser to MPM, it will be appreciated that the laser can be used for other applications.

The three pulses can be delivered to a target, for example, within the response time of a CCD or image sensor. By equalizing the optical paths of the pulses, the pulses can be delivered such that they arrive within the duration of any one pulse. The three pulses can all travel in one optical path or travel over three different optical paths.

Fiber MOPA 1B includes a pump laser source 1 arranged to deliver a train of single-mode, picosecond pulse duration at a PRF from few megahertz (MHz) to about 100 MHz. These pulses are amplified by a first fiber-amplifier 2 and delivered to a 50/50 coupler. The amplified pulses are directed by the coupler to a second fiber-amplifier 5A and fiber-amplifier 5B. Before entering fiber-amplifier 5A, the amplified pump pulses are combined with the output of one or both CW seed lasers 3 and 4. The amplified pulses from fiber-amplifier 5A experience SRS (spectral shift to the wavelength of seed laser 3 and/or to the wavelength of seed laser 4) and, advantageously, the Raman shifted pulses experience SPM (spectral broadening) along a defined length of fiber Raman amplifier 6A. At the end of fiber 6A, a fiber WDM is used that transmits radiation longer than the fundamental wavelength of the pump laser source 1. Amplified pulses from fiber-amplifier 5B experience spectral broadening by SPM along a defined length of single mode-fiber 6B and are then combined with the long-wavelength output-pulses from fiber Raman amplifier 6A by another fiber WDM. The output-pulses are then directed to a pulse-compressor 7.

The femtosecond range laser system described herein has the ability to be driven at one or more wavelengths. The CW seed sources 3 and 4 in FIG. 4 can be controlled by switches and controllers 8 and 9 to control what wavelength and repetition rate is output by the laser system 10. The controller 9 can be a high frequency drive signal source for each of the one or more CW seed sources. The controller 9 need not operate at the same frequency as the pump source 1, allowing the seed sources to be on or off for a number of pulses produced by the pump source 1. The wavelength selector 8 can turn on or off the drive signal for each respective drive signal source in controller 9. Pulse width modulation can be used with the seed sources to change an effective duty cycle and thus vary the output power of the laser system at a desired wavelength.

When the wavelength selector 8 turns on the drive signal to power a particular seed source, then power at the wavelength of the seed source will be generated through Raman conversion in fiber 6A. When the laser system 10 is configured to block output at the pump source wavelength (this is not the typical configuration illustrated in FIG. 4, but can be the typical configuration of the embodiment of FIG. 1), the laser system output is controlled by the powering of the seed sources, namely, the laser will have no output if the seed sources are off. Thus, the selector 8 can be used to signal to the controller 9 which wavelength or wavelengths are to be emitted from the laser.

When two wavelengths are to be generated, powering two seeds at the same time will cause the two seed wavelengths to compete for the available SRS pump power at the pump laser source wavelength. If the fiber comprising the fiber Raman amplifier is p-doped fiber and the two seed wavelengths correspond to the first-order silica and phosphorous Raman shifts, the relative power of the pulses at the two Raman shifted wavelengths can be controlled by controlling the individual seed source powers. However, in the special case where the seed wavelengths correspond to the first- and second-order Raman shifts in silica fiber, the second-order Raman shifted pulses grow through the Raman conversion (i.e. depletion) of the power of the first-order Raman pulses. This can lead to an imbalance of the power at each of the two seed wavelengths which can be difficult to control even by controlling the individual seed source powers. On the other hand, by alternating between seed sources, the output of the laser system can comprise pulses that alternate between the desired wavelengths. This alternating can be at the frequency of the train of picosecond pulses generated by the source laser 1, or it can be at a lower frequency.

It is emphasized here that the configuration described above should not be construed as limiting the present invention. Those skilled in the art, from the description provided herein may employ other fiber-MOPA configurations of comparable output characteristics, or bulk solid-state lasers with Yb-doped or other doped gain media, without departing from the spirit and scope of the present invention.

Whatever the fiber-MOPA configuration, it is preferable that pulses from the pump laser source 1 are single-mode-pulses and have a duration between about 10 ps and about 25 ps. The output power from amplifier 2 is preferable to be higher than about 30 mW of average power.

FIG. 5 is a two-dimensional view schematically depicting the spectrally-selective pulse-compressor 7A. Here the generated Raman pulses from Raman fiber amplifier 6A are collimated and directed by turning mirror 11. The collimated spectrum is diverged by grating 12 in what can be considered a continuous sheet of rays. Gratings 13, 14 and 15 are placed at the same or different slant distance L from grating 12. The initially collimated spectrum once diverged has a width at the second grating (13, 14 or 15) dependent on the generated Raman-pulsed spectrum, the groove density of the grating 12, and the slant distance L. Gratings 12 and 15 are used to compress the fundamental wavelength of the pump laser source 1. Gratings 12 and 14 are used to compress the spectrum centered at wavelength of CW seed laser 3. Gratings 12 and 13 are used to compress the spectrum centered at wavelength of CW seed laser 4. The spectrally-selective apertures, placed between gratings 13, 14 and 15, and retro-reflectors R1, R2 and R3, are used to eliminate any extraneous radiation around the CW seed wavelengths. These apertures narrow the spectrum of the selected wavelengths. The three colours (in this case, the three infrared wavelengths) are combined back at grating 12 and directed by the tuning mirror 16. Retro-reflectors R1, R2 and R3 are placed on a translation stages to match the optical paths of the three different wavelengths. It should be noted that using this selective compressor, it is possible to combine the pulses on the same path at point F. It is also possible to have the compressed pulses on separate paths using compressor 7B as shown in FIG. 7.

Continuing with reference to FIGS. 1 and 5, the spectrally selective pulse-compressor 7A receives collimated pulses from fiber Raman amplifier 6A. The received Raman pulses are directed by turning mirror 11 to compressor grating 12, from which the beam is diffracted and collected by gratings 13, 14, and 15. In one example case, if the pump laser source wavelength is 1030 nm and the CW seed wavelengths are 1090 nm and 1189.5 nm and the fiber of Raman amplifier 6A is p-doped fiber (for example, spectrum shown in FIG. 3), Gratings 12 and 14 could be used to compress the pulses with spectrum centered at the wavelength of 1090 nm. Gratings 12 and 13 could be used to compress the pulses with spectrum centered at the wavelength of 1189.5 nm. The spectrally-selective apertures, placed between gratings 13 and 14 and retro-reflectors R1 and R2, could be used to select a spectral bandwidth of approximately 20 nm around each of the central wavelengths mentioned above. The two colours (in this case, centered at wavelengths of 1090 nm and 1189.5 nm) are combined back at a lower height at grating 12 and directed by the tuning mirror 16. Grating 15 and retro-reflector R3 of compressor 7A are omitted in this case as the available pump power left at the pump laser source wavelength is not high enough for MPM. Grating 15 and retro-reflector R3 of compressor 7A could be used to compress pulses at the pump laser source wavelength if the laser system shown in FIG. 4 is used instead.

FIG. 6 is a reproduction of an autocorrelation-trace of a pulse formed by selecting 20 nm of the 1189.5 nm spectral-band of FIG. 3 after compression in the spectrally selective pulse-compressor. The pulse has a duration of about 200 fs.

Figure 7:
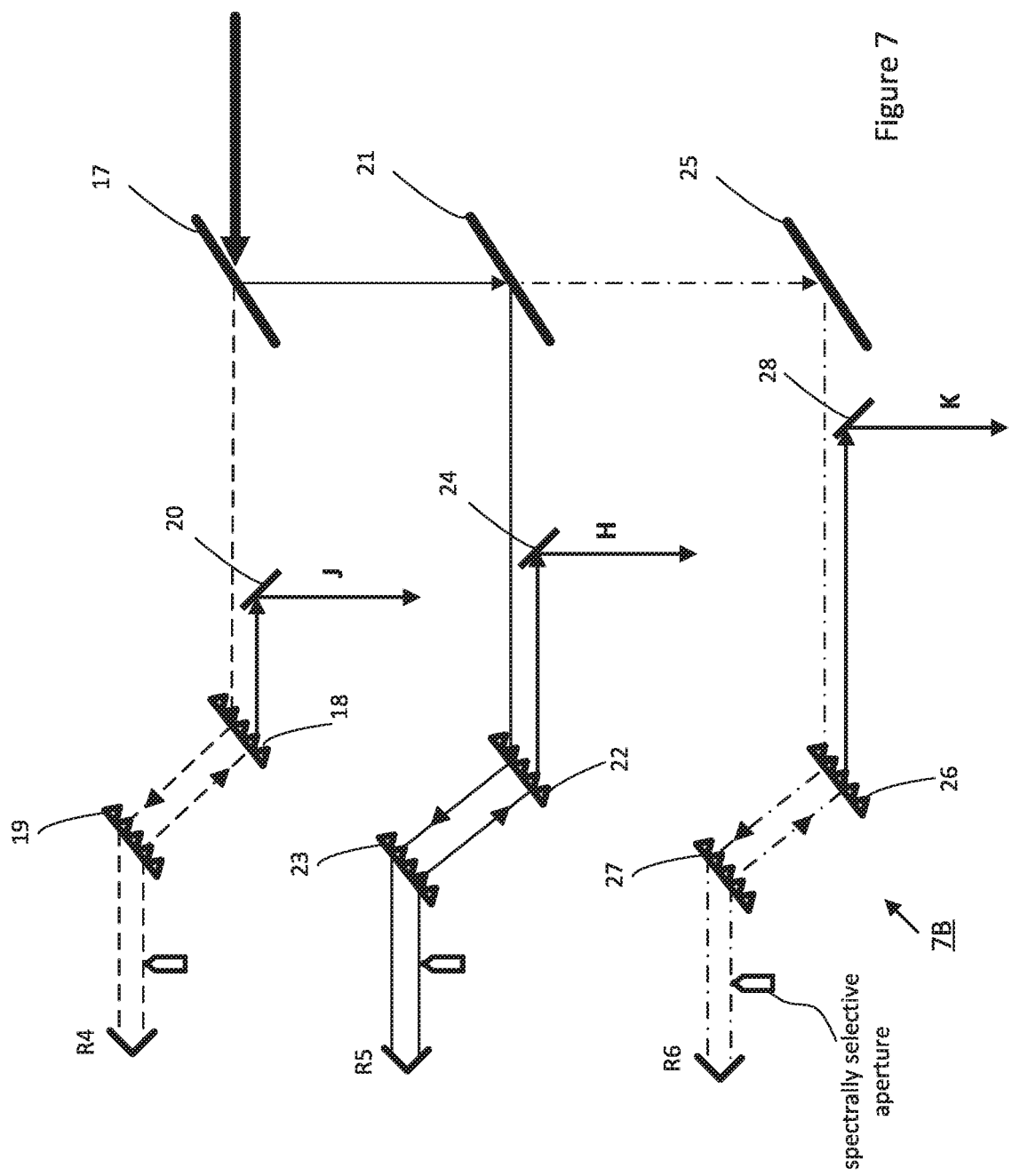
FIG. 7 is a two-dimensional view schematically depicting the spectrally-selective pulse-compressor.

FIG. 7 is a two-dimensional view schematically depicting the spectrally-selective pulse-compressor 7B. Here the collimated spectrum from fiber Raman amplifier 6A is spectrally divided by a spectrally-selective beam splitters 17, 21 and 25. The beam splitters direct the spectrally selected pulses to a two-grating compressor arrangement. The spectrally-selective apertures selects the desired region of the generated spectrum around the fundamental wavelength of the pump laser source 1 and around the center wavelengths of CW seed lasers 3 and 4. The selected regions of the spectra are reflected back by retro-reflectors R4, R5 and R6 at a lower height to mirror 20, mirror 24 and mirror 28, respectively. The three selected spectral peaks traverse three different optical paths J, H, and K. As an example, for the case of a pump laser source wavelength of 1030 nm and a p-doped fiber Raman amplifier, the central wavelengths of the three spectral peaks can be 1030 nm, 1090 nm and 1189.5 nm.

The preferred groove density of the gratings can be about 1000 l/mm, however, other gratings with different groove density are also possible to use in the schematic of spectrally-selective compressor 7A and 7B.

While other types of pulse compressors can be used, for example, an in-fiber compressor, they can offer their own challenges as will be understood by the person skilled in the art.

What is claimed is:
1. A femtosecond laser system comprising:
    a pump laser source emitting a train of picosecond-range optical pump pulses;
    at least one continuous wave (CW) seed source;
    a length of optical fiber coupled to said pump laser source and to said at least one CW seed source so that emission from said at least one CW seed source co-propagates with said train of picosecond-range optical pump pulses, and in which at least one Raman shift conversion from the wavelength of said pump laser source to the wavelength of said at least one CW seed source takes place and in which self-phase modulation of the Raman shifted pulses takes place to produce a spectrally broadened pulse train of picosecond-range duration optical pulses;

at least one optical pulse compressor to compress said spectrally broadened pulse train of picosecond-range duration optical pulses to a train of femtosecond-range duration pulses;

wherein a pulse width duration and peak power of said train of picosecond-range optical pump pulses leads to efficient Raman conversion and self-phase modulation of said Raman shifted pulses in said length of optical fiber so that said optical compressor can efficiently provide said train of femtosecond-range duration pulses at the wavelength of said Raman shifted pulses.

2. The laser system as defined in claim 1, wherein said pump laser source comprises at least one optical fiber amplifier.

3. The laser system as defined in claim 1, wherein said pump laser source comprises a mode-locked laser.

4. The laser system as defined in claim 1, further comprising a switch for controlling said at least one CW seed source so that emission of femtosecond-range duration pulses can be controlled by said switch.

5. The laser system as defined in claim 4, comprising two said CW seed sources, said train of femtosecond-range duration pulses comprising emission at two wavelengths corresponding to two Raman shifts.

6. The laser system as defined in claim 4, further comprising a controller for said switch for temporally modulating said at least one CW seed source for selecting a variable repetition rate for said train of femtosecond-range duration pulses comprising emission at a wavelength corresponding to said Raman shift.

7. The laser system as defined in claim 5, further comprising a controller for said switch for temporally modulating said CW seed sources for emitting pulses alternating between said two wavelengths.

8. The laser system as defined in claim 5, further comprising a controller for said switch for temporally modulating said CW seed sources for selecting between zero, one and two said Raman shift wavelengths being present in said train of femtosecond-range duration pulses.

9. The laser system as defined in claim 1, wherein said pump laser source comprises a by-pass optical fiber amplifier through which only said train of picosecond-range optical pump pulses passes and whose output by-passes said length of optical fiber in which said at least one Raman shift conversion takes place and instead undergoes self-phase modulation spectral broadening in a separate length of optical fiber.

10. The laser system as defined in claim 1, wherein said length of optical fiber in which said at least one Raman shift conversion takes place comprises phosphorous-doped silica optical fiber.

11. The laser system as defined in claim 1, wherein said length of optical fiber in which said at least one Raman shift conversion takes place comprises silica optical fiber.

12. The laser system as defined in claim 2, wherein said at least one CW seed source is launched into said at least one of said at least one optical fiber amplifier to propagate together with said train of picosecond-range optical pump pulses and then into said length of optical fiber in which said at least one Raman shift conversion takes place.

13. The laser system as defined in claim 1, wherein said at least one optical pulse compressor is wavelength tunable.

* * * * *

UNITED STATES PATENT AND TRADEMARK OFFICE
CERTIFICATE OF CORRECTION

PATENT NO. : 10,862,263 B1
APPLICATION NO. : 16/892242
DATED : December 8, 2020
INVENTOR(S) : Alaa Al-Kadry, Vladimir Karpov and Wallace Raymond Lovett Clements It is certified that error appears in the above-identified patent and that said Letters Patent is hereby corrected as shown below:

In the Specification

Column 2, Line 15, delete "an" and insert -- a --, therefor.

Column 5, Line 7, delete "FHWM" and insert -- FWHM --, therefor.

Column 5, Line 38, delete "of fiber of fiber" and insert -- of fiber --, therefor.

Column 8, Line 51, delete "density" and insert -- densities --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*